(12) United States Patent
Liu et al.

(10) Patent No.: US 7,288,321 B2
(45) Date of Patent: Oct. 30, 2007

(54) CARBON NANOTUBE ARRAY AND METHOD FOR FORMING SAME

(75) Inventors: Liang Liu, Beijing (CN); Shou-Shan Fan, Beijing (CN)

(73) Assignees: Tsinghua University, Beijing (CN); Hon Hai Precision Ind. Co., Ltd., Tu-Cheng (TW)

( * ) Notice: Subject to any disclaimer, the term of this patent is extended or adjusted under 35 U.S.C. 154(b) by 450 days.

(21) Appl. No.: 10/402,737

(22) Filed: Mar. 28, 2003

(65) Prior Publication Data

US 2004/0101468 A1    May 27, 2004

(30) Foreign Application Priority Data

Nov. 21, 2002    (CN)    ................................. 02 1 52047

(51) Int. Cl.
   *D01F 9/12*    (2006.01)
(52) U.S. Cl. .................................... 428/408; 423/447.3
(58) Field of Classification Search ............. 423/447.3; 428/368, 408
   See application file for complete search history.

(56) References Cited

U.S. PATENT DOCUMENTS

| | | | |
|---|---|---|---|
| 4,831,212 A * | 5/1989 | Ogata et al. ................ | 174/546 |
| 6,232,706 B1 * | 5/2001 | Dai et al. ................... | 313/309 |
| 6,277,318 B1 | 8/2001 | Bower et al. | |
| 6,297,592 B1 * | 10/2001 | Goren et al. ................ | 315/3.5 |
| 6,538,367 B1 * | 3/2003 | Choi et al. ................. | 313/309 |
| 6,690,116 B2 * | 2/2004 | Song et al. ............... | 315/169.3 |
| 6,759,025 B2 * | 7/2004 | Hong et al. ............... | 423/447.3 |
| 6,882,098 B2 * | 4/2005 | Choi et al. ................ | 313/495 |
| 2002/0102353 A1 * | 8/2002 | Mauthner et al. ....... | 427/255.28 |

FOREIGN PATENT DOCUMENTS

| | | |
|---|---|---|
| CN | 1241813 A | 1/2000 |
| CN | 1277145 A | 12/2000 |
| TW | 464896 | 11/2001 |

OTHER PUBLICATIONS

Sumio Iijima, "Helical Microtubules of Graphitic Carbon" Nature, vol. 354, Nov. 7, 1991, pp. 56-58.
Ch. Emmenegger et al. "Carbon Nanotube Synthesized on Metallic Substrate" Applied Surface Science, vol. 162-163, 2000, pp. 452-456.

* cited by examiner

*Primary Examiner*—Stuart Hendrickson
(74) *Attorney, Agent, or Firm*—Wei Te Chung

(57) ABSTRACT

A method for forming a carbon nanotube array on a metal substrate includes the following steps: providing a metal substrate (11); depositing a silicon layer (21) on a surface of the metal substrate; depositing a catalyst layer (31) on the silicon layer; annealing the treated substrate; heating the treated substrate up to a predetermined temperature in flowing protective gas; introducing a carbon source gas for 5-30 minutes; and thus forming a carbon nanotube array (51) extending from the treated substrate. Generally, any metallic material can be used as the metal substrate. Various carbon nanotube arrays formed using various metal substrates can be incorporated into a wide variety of high power electronic device applications such as field emission devices (FEDs), electron guns, and so on. Carbon nanotubes formed using any of a variety of metal substrates are well aligned, and uniformly extend in a direction substantially perpendicular to the metal substrate.

13 Claims, 4 Drawing Sheets

CARBON NANOTUBE ARRAY AND METHOD FOR FORMING SAME

BACKGROUND OF THE INVENTION

1. Field of the Invention

The present invention relates to carbon nanotube arrays and methods for forming them, and more particularly to carbon nanotube arrays formed on metal substrates and methods for forming said carbon nanotube arrays. This application relates to a contemporaneously filed application having the same title, the same applicant and the same assignee with the instant application.

2. Description of Prior Art

Carbon nanotubes are very small tube-shaped structures each having the structure of a graphite sheet rolled into a tube. Carbon nanotubes produced by arc discharge between graphite rods were first discovered and reported in an article by Sumio Iijima entitled "Helical Microtubules of Graphitic Carbon" (Nature, Vol. 354, Nov. 7, 1991, pp. 56-58). Carbon nanotubes have excellent mechanical properties such as a high Young's modulus, a high elastic modulus, and low density. Carbon nanotubes also have excellent electrical, electromechanical and absorption properties. Carbon nanotubes display metallic properties or semiconductor properties according to different ways in which the graphite sheet is rolled. Due to these and other properties, it has been suggested that carbon nanotubes can play an important role in fields such as microscopic electronics, materials science, biology and chemistry.

The chemical vapor deposition method is known in the art as being conducive to growing carbon nanotube arrays with well aligned carbon nanotubes. In the chemical vapor deposition method, a carbon source gas is thermally decomposed at a predetermined temperature in the presence of a transition metal that acts as a catalyst, thereby forming a carbon nanotube array.

When a carbon nanotube array is used as an electrode in a field emission display, electron gun or other high power electronic device, the substrate on which the carbon nanotube array is formed must have good conductivity and the ability to carry high current loads. Thus, a metal substrate is best for such applications.

However, carbon nanotube arrays are generally formed on nonmetallic substrates such as silicon, silicon oxide or glass. This is because metal substrates generally impair high-density formation of pure, straight carbon nanotubes. In particular, a metal substrate is liable to react with the nanotube catalyst to form an alloy thereof, which renders the catalyst inactive. In addition, when the metal substrate itself is the catalyst, it is prone to decompose the carbon source gas to form amorphous carbon. The amorphous carbon inhibits formation of carbon nanotubes of the desired quality. In summary, it is difficult to optimally form carbon nanotubes using metal substrates.

A carbon nanotube assembly and method for producing the same are disclosed in China patent application CN1241813A. The assembly comprises a metal substrate and a coating of carbon nanotubes deposited thereon. The method includes the following steps: (1) separating formed single wall carbon nanotubes by chemical cutting technology; (2) dispersing the separated carbon nanotubes uniformly in water to form a water-soluble gel, and allowing the water-soluble gel to settle for an extended period; (3) selecting a band of the water-soluble gel which contains carbon nanotubes having a desired uniform length; (3) diluting the selected band of water-soluble gel with deionized water; and (4) coating the selected carbon nanotubes on a clean metal substrate to form carbon nanotubes standing upright on the metal substrate. However, this method does not provide original formation of carbon nanotubes directly on the metal substrate. In addition, when said water-soluble gel is allowed to settle, the time required is unduly long: typically around one month. These difficulties greatly limit industrial applications of the carbon nanotube assembly and method.

A method for producing a carbon nanotube array on an aluminum (Al) substrate was reported in an article by Ch. Emmenegger et al. entitled "Carbon nanotube synthesized on metallic substrate" (Applied Surface Science, Vol. 162-163, 2000, pp. 452-456). The method comprises the following steps: (1) coating iron nitrate ($Fe(NO_3)_3$) on an aluminum substrate; (2) annealing the substrate with the $Fe(NO_3)_3$ film to form nano-sized particles of ferric oxide ($Fe_2O_3$); and (3) introducing a mixture of carbon source gas and protective gas until a carbon nanotube array extends from the substrate.

However, the metallic material used as the substrate in the above-described method by Ch. Emmenegger et al. is limited to just several metals such as aluminum and nickel (Ni). This limitation is necessary to prevent the metal substrate from adversely affecting formation of the carbon nanotubes by reacting with the catalyst or by decomposing the carbon source gas to form amorphous carbon. Accordingly, the method is generally limited to applications in which aluminum and nickel electronic devices can be utilized.

SUMMARY OF THE INVENTION

In view of the above-described drawbacks, an object of the present invention is to provide a method for forming a carbon nanotube array using a metal substrate, wherein the metal substrate may be any one of a wide variety of metallic materials.

Another object of the present invention is to provide a carbon nanotube array formed using a metal substrate, wherein the metal substrate can be used as an electrode in a high power electronic device.

In order to achieve the objects set out above, a preferred method of the present invention for forming a carbon nanotube array using a metal substrate comprises the following steps: providing a metal substrate; depositing a silicon layer on a surface of the metal substrate; depositing a catalyst layer on the silicon layer; annealing the treated substrate; heating the treated substrate up to a predetermined temperature in flowing protective gas; introducing a carbon source gas for 5-30 minutes; and thus forming a carbon nanotube array extending from the treated substrate. Generally, any metallic material can be used as the metal substrate. Various carbon nanotube arrays formed using various metal substrates can be incorporated into a wide variety of high power electronic device applications such as field emission devices (FEDs), electron guns, and so on. Carbon nanotubes formed using any of a variety of metal substrates are well aligned, and uniformly extend in a direction substantially perpendicular to the metal substrate.

Other objects, advantages and novel features of the present invention will become more apparent from the following detailed description when taken in conjunction with the accompanying drawings, in which:

DETAILED DESCRIPTION OF PREFERRED EMBODIMENTS OF THE INVENTION

Figure 1:
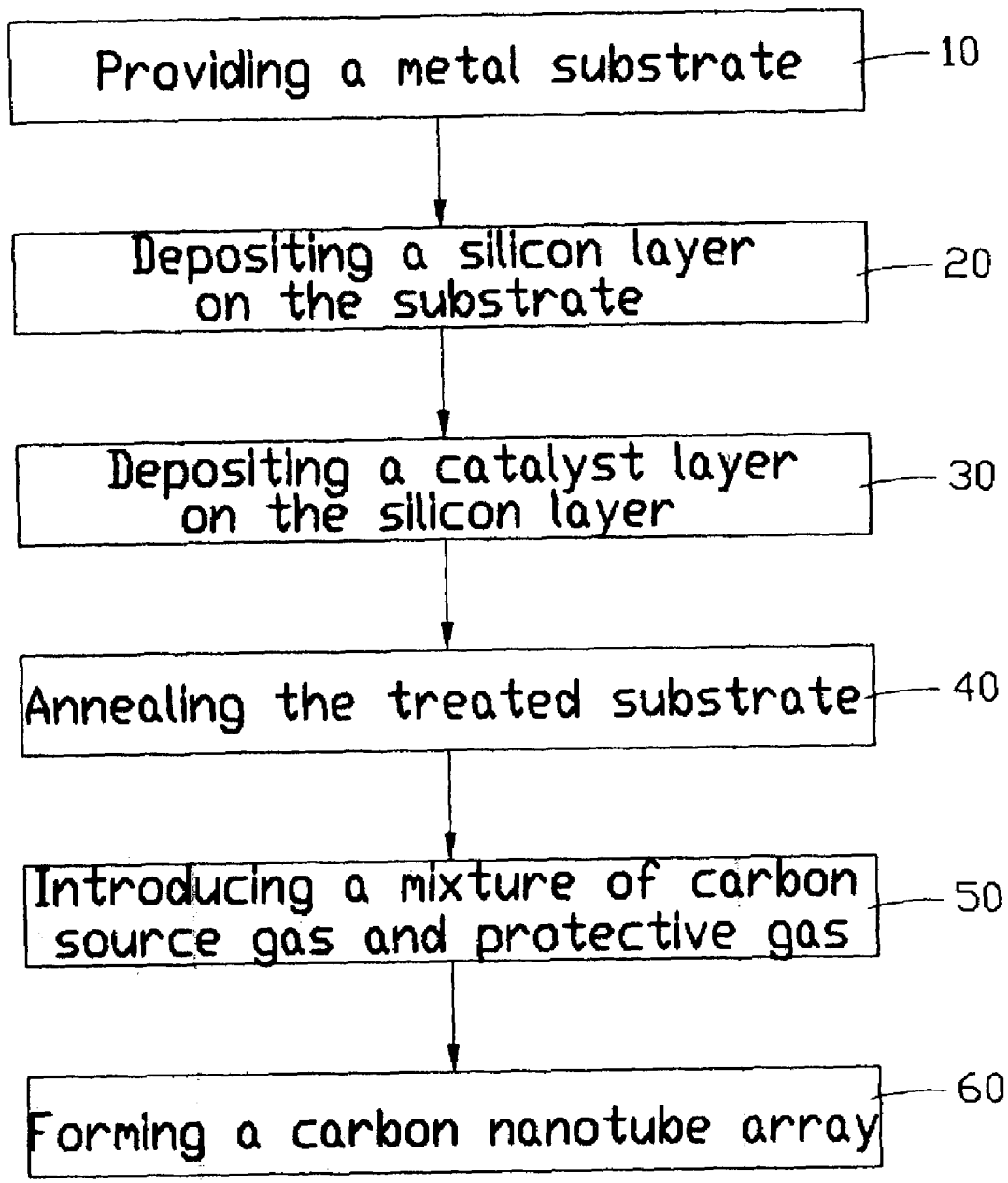
FIG. 1 is a flowchart of a preferred method for forming a carbon nanotube array using a metal substrate according to the present invention.
Figure 2:
FIG. 2 is a schematic view of a metal substrate used in the preferred method of the present invention.
Figure 3:
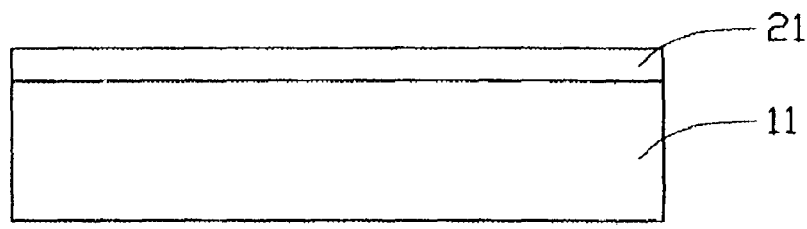
FIG. 3 is a schematic view of the substrate of FIG. 2 with a silicon layer thereon.
Figure 4:
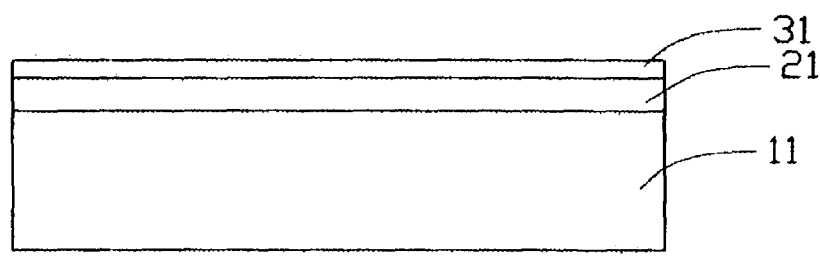
FIG. 4 is a schematic view of the treated substrate of FIG. 3 with a metal catalyst layer formed on the silicon layer.
Figure 5:
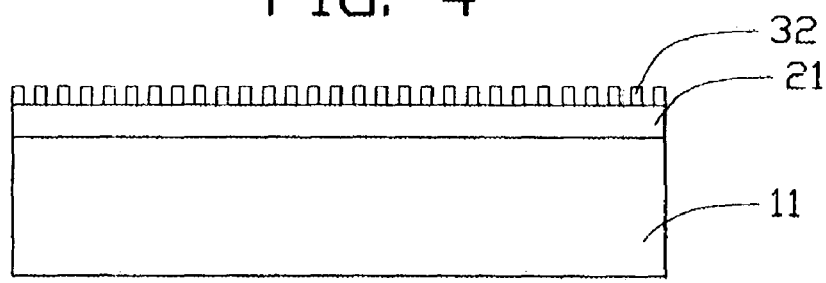
FIG. 5 is a schematic view of the treated substrate of FIG. 4 after annealing, wherein the catalyst layer has become catalyst particles.
Figure 6:
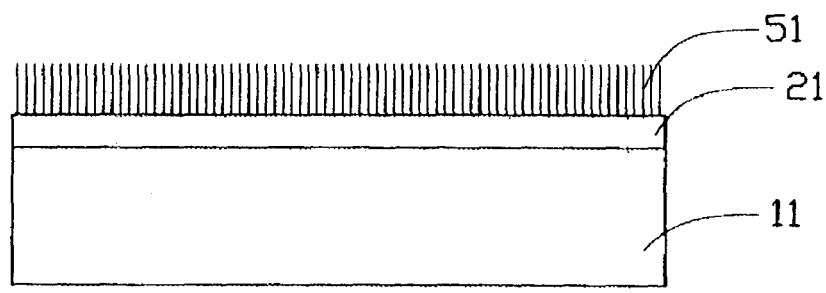
FIG. 6 is a schematic view of a carbon nanotube array formed on the treated substrate of FIG. 5.

A preferred method for forming a carbon nanotube array using a metal substrate according to the present invention will be described with reference to the flowchart of FIG. 1.

Referring also to FIGS. 2-6, a metal substrate 11 is first provided (step 10). The metal substrate 11 can be a metal plate or a metal electrode formed on a base. If a base is used, it can be glass, silicon, quartz or another suitable material having a smooth surface. The metal electrode can be formed on the base by plating or sputtering. The selected metal plate or metal electrode is polished to obtain a smooth surface thereon. The metal substrate 11 can be nickel (Ni), steel, tantalum (Ta), silver (Ag) or another suitable metallic material.

In principle, there is no particular limitation on selection of the metal plate material or the metal electrode material. Any metallic material used in the semiconductor industry can be used as the metal substrate 11. However, there are four criteria that must be satisfied when selecting the metal plate material or metal electrode material: (1) the metal plate material or metal electrode material does not melt at temperatures below chemical vapor deposition (CVD) temperatures; (2) the metal electrode material does not melt with its accompanying base at temperatures below CVD temperatures; (3) in the temperature range from room temperature to CVD temperature, a coefficient of thermal expansion of the metal electrode material is compatible with that of its accompanying base; and (4) during formation of carbon nanotubes, the metal plate material or metal electrode material does not expand or break if it absorbs hydrogen. In the preferred method, nickel is used as the metal plate material, and tantalum is used as the metal electrode material.

Next, a silicon layer 21 is deposited on a surface of the metal substrate 11 by electron beam evaporation or thermal evaporation (step 20). The silicon layer 21 has a thickness of several tens of nanometers. Then a metal catalyst layer 31 is deposited on a surface of the silicon layer 21 by electron beam evaporation, thermal evaporation or sputtering (step 30). The catalyst layer 31 has a thickness in the range from several nanometers to several hundred nanometers. The catalyst layer 31 can be iron (Fe), cobalt (Co), nickel (Ni), or any suitable combination alloy thereof. In the preferred method, iron is used as the catalyst layer 31, and is deposited on the surface of the silicon layer 21 to a thickness of 5 nanometers.

The treated metal substrate 11 is annealed in air at 300-400° C. for 10 hours (step 40), thereby oxidizing the catalyst layer and forming catalyst particles 32.

The treated metal substrate 11 is put into a quartz boat, which is inserted into the center of a 1-inch quartz tube furnace. The tube furnace is then heated up to a predetermined temperature in flowing protective gas. The protective gas can be a noble gas or nitrogen. In the preferred method, argon is used as the protective gas. The predetermined temperature varies according to the catalyst used. In the preferred method, iron is used as the catalyst, and the predetermined temperature is 500-700° C., preferably 650° C.

Prefereably, the treated metal substrate 11 is then reduced to form catalyst particles (not shown) having nano-sized diameters using hydrogen or ammonia gas. However, such reduction is an optional procedure that may be omitted. A mixture of carbon source gas and protective gas is then introduced into the tube furnace (step 50). The carbon source gas can be acetylene, ethylene, or any suitable chemical compound which contains carbon. The protective gas can be a noble gas or nitrogen. In the preferred method, acetylene is used as the carbon source gas, and argon is used as the protective gas. The protective gas and carbon source gas are introduced at suitable predetermined flow rates respectively. The mixture of carbon source gas and protective gas is introduced under these conditions for 5-30 minutes, thus forming the carbon nanotube array 51 extending from the silicon layer 21 (step 60). The tube furnace is then cooled down to room temperature.

In an alternative method, the tube furnace is evacuated, and a carbon source gas is introduced for 5-30 minutes, thus forming the carbon nanotube array 51 extending from the silicon layer 21. The carbon source gas in this method may, for example, be acetylene.

Figure 7:
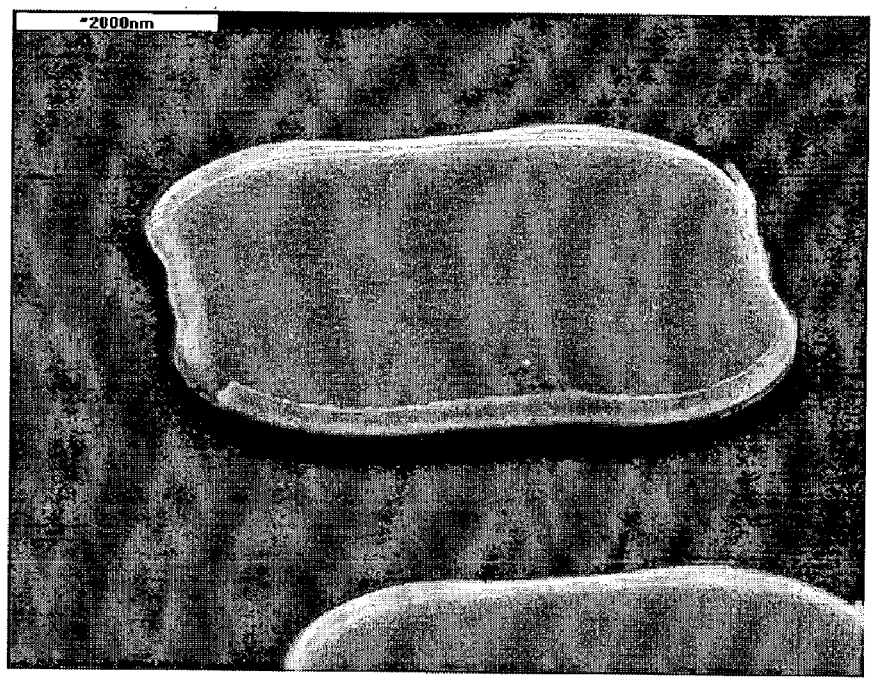
FIG. 7 shows a scanning electron microscope (SEM) image of a tantalum (Ta) electrode formed on a silicon base by using the preferred method of the present invention.
Figure 8:
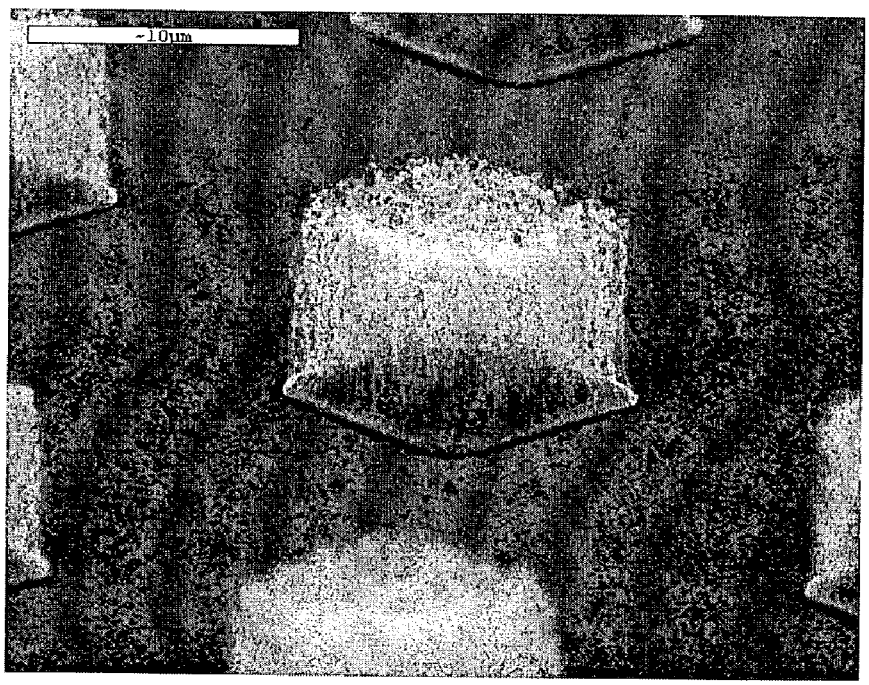
FIG. 8 shows an SEM image of a carbon nanotube array formed on the tantalum electrode of FIG. 7 by using the preferred method of the present invention.
Figure 9:
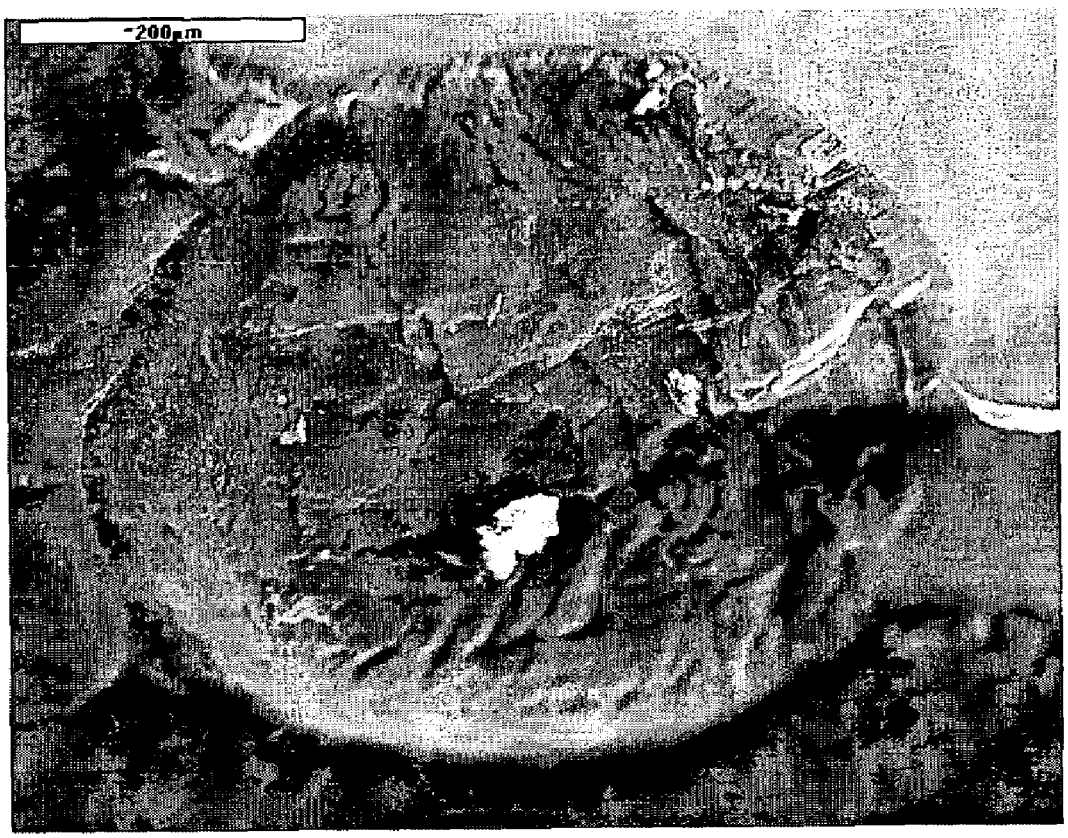
FIG. 9 shows an SEM image of a carbon nanotube array formed on a nickel (Ni) anode of an electron gun by using the preferred method of the present invention.

It will be apparent to those having skill in the field of the present invention that the silicon layer 21 formed on the metal substrate 11 prevents the metal substrate 11 from reacting with the catalyst, and prevents the metal substrate 11 from decomposing the carbon source gas to form amorphous carbon. Furthermore, the silicon layer 21 maintains the conditions for forming carbon nanotubes as used in conventional CVD methods. Thus, generally, any metallic material can be used as the metal substrate 11. Various carbon nanotube arrays 51 formed using various metal substrates 11 can be incorporated into a wide variety of high power electronic device applications such as field emission devices (FEDs), electron guns, and so on. FIG. 7 shows an SEM image of a tantalum electrode formed on a silicon base using the preferred method of the present invention. FIG. 8 shows an SEM image of a carbon nanotube array formed on the tantalum electrode of FIG. 7 by using the preferred method of the present invention. FIG. 9 shows an SEM image of a carbon nanotube array formed on a nickel anode of an electron gun by using the preferred method of the present invention. As can be seen, carbon nanotubes of the carbon nanotube arrays formed on the different metal substrates are well aligned, and uniformly extend in a direction substantially perpendicular to the metal substrate.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A method for forming a carbon nanotube array, comprising:
   providing a metal substrate comprised of a material selected from the group consisting of nickel and silver;
   depositing a silicon layer on a surface of the substrate, a thickness of the silicon layer being several tens of nanometers;
   depositing a catalyst layer on the silicon layer, a thickness of the catalyst layer being in the range from several nanometers to several hundred nanometers; and
   introducing a carbon source gas and a protective gas at a predetermined temperature, the carbon nanotube array forming and extending from the treated substrate.

2. The method for forming a carbon nanotube array as described in claim 1, wherein the substrate is a metal plate, or a metal electrode formed on a base.

3. The method for forming a carbon nanotube array as described in claim 1, further comprising the following step after the step of providing a metal substrate: polishing the substrate to obtain a smooth surface thereon.

4. The method for forming a carbon nanotube array as described in claim 1, wherein the catalyst layer comprises material selected from the group consisting of iron, cobalt, nickel and any suitable combination alloy thereof.

5. The method for forming a carbon nanotube array as described in claim 4, wherein the catalyst layer comprises iron, and has a thickness of approximately 5 nanometers.

6. The method for forming a carbon nanotube array as described in claim 1, wherein the catalyst layer comprises iron and the predetermined temperature is in the range of about 500~700° C.

7. The method for forming a carbon nanotube array as described in claim 6, wherein the predetermined temperature is approximately 650° C.

8. The method for forming a carbon nanotube array as described in claim 1, wherein the protective gas is selected from the group consisting of nitrogen and a noble gas.

9. The method for forming a carbon nanotube array as described in claim 1, wherein the carbon source gas is selected from the group consisting of acetylene and ethylene.

10. The method for forming the carbon nanotube array as described in claim 1, wherein the reducing gas is hydrogen or ammonia gas.

11. The method for forming the carbon nanotube array as described in claim 1, wherein before the introduction of the carbon source gas and protective gas, a step of annealing the treated substrate in air at a temperature of about 200~400° C. for forming catalyst particles having nano-sized diameters is preformed.

12. The method for forming the carbon nanotube array as described in claim 11, further comprising the following step just prior to the step of introducing a carbon source gas and a protective gas at the determined temperature, heating the treated metal substrate in a flowing reducing gas to reduce the nano-sized catalyst particles.

13. A carbon nanotube array assembly comprising:
   a metal substrate comprised of a material selected from the group consisting of nickel and silver;
   a polycrystalline silicon layer formed on the substrate, a thickness of the silicon layer being several tens of nanometers; and
   a carbon nanotube array deposited generally on the silicon layer.

* * * * *